US012591230B2

(12) United States Patent
Hu et al.

(10) Patent No.: US 12,591,230 B2
(45) Date of Patent: Mar. 31, 2026

(54) DETECTING OR PREDICTING SYSTEM FAULTS IN COOLING SYSTEMS IN A NON-INTRUSIVE MANNER USING DEEP LEARNING

(71) Applicant: Board of Trustees of the University of Arkansas, Little Rock, AR (US)

(72) Inventors: Han Hu, Fayetteville, AR (US); Hari Pandey, Fayetteville, AR (US); Christy Dunlap, Fayetteville, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 579 days.

(21) Appl. No.: 18/078,774

(22) Filed: Dec. 9, 2022

(65) Prior Publication Data

US 2023/0195094 A1     Jun. 22, 2023

Related U.S. Application Data

(60) Provisional application No. 63/291,248, filed on Dec. 17, 2021.

(51) Int. Cl.
*G05B 23/02* (2006.01)
*G06T 7/00* (2017.01)
(Continued)

(52) U.S. Cl.
CPC ........ *G05B 23/0221* (2013.01); *G06T 7/0004* (2013.01); *H04R 1/08* (2013.01);
(Continued)

(58) Field of Classification Search
CPC ............ G05B 23/0221; G05B 2223/02; G05B 23/024; G06T 7/0004; G06T 2207/20081;
(Continued)

(56) References Cited

U.S. PATENT DOCUMENTS 4,996,403 A     2/1991  White
6,236,025 B1    5/2001  Berkcan et al.
(Continued)

OTHER PUBLICATIONS

Sinha et al., "Deep Learning the Sound of Boiling for Advance Prediction of Boiling Crisis," Cell Reports Physical Science, vol. 2, 100382, Mar. 24, 2021, pp. 1-14.

*Primary Examiner* — Manuel A Rivera Vargas
(74) *Attorney, Agent, or Firm* — Robert A. Voigt; Shackelford, McKinley & Norton, LLP

(57)                    ABSTRACT

A computer-implemented method, system and computer program product for detecting or predicting system faults in cooling systems. A model (deep learning model) is built and trained to detect or predict system faults in a cooling system based on acoustic emission signals (both in temporal and frequency domains) and/or imaging signals. Upon training the model to detect or predict system faults in a cooling system, acoustic emission signals may be obtained non-intrusively from the cooling system using acoustic emission sensors, hydrophones and/or microphones. Additionally, upon training the model to detect or predict system faults in a cooling system, imaging signals (e.g., boiling images) may be obtained non-intrusively from the cooling system using optical sensors (e.g., high-speed camera). The trained model may then detect or predict a system fault in the cooling system based on such information (acoustic emission signals, including in temporal and frequency domains, and/or the imaging signals).

16 Claims, 10 Drawing Sheets

(51) Int. Cl.

| | |
|---|---|
| *H04R 1/08* | (2006.01) |
| *H04R 3/00* | (2006.01) |
| *H04R 3/04* | (2006.01) |
| *H05K 7/20* | (2006.01) |

(52) U.S. Cl.

CPC .............. *H04R 3/005* (2013.01); *H04R 3/04* (2013.01); *G05B 2223/02* (2018.08); *G06T 2207/20081* (2013.01); *G06T 2207/20084* (2013.01); *G06T 2207/30108* (2013.01); *H04R 2410/01* (2013.01); *H05K 7/2029* (2013.01)

(58) Field of Classification Search

CPC   G06T 2207/20084; G06T 2207/30108; H04R 1/08; H04R 3/005; H04R 3/04; H04R 2410/01; H04R 3/06; H05K 7/2029

See application file for complete search history.

(56)                              References Cited

U.S. PATENT DOCUMENTS

| | | | |
|---|---|---|---|
| 7,248,985 B2 * | 7/2007 | Dwyer ................... | G01H 1/003 |
| | | | 702/108 |
| 11,169,288 B1 * | 11/2021 | Johnson ................ | G06N 20/10 |
| 2002/0194915 A1 * | 12/2002 | Abdel-Malek ......... | G01N 29/14 |
| | | | 73/587 |
| 2008/0256398 A1 * | 10/2008 | Gross ..................... | G06F 11/00 |
| | | | 714/47.2 |
| 2011/0166830 A1 | 7/2011 | Lehmann | |
| 2016/0267387 A1 * | 9/2016 | Prabha ................... | G06N 20/00 |
| 2020/0033297 A1 | 1/2020 | Rudyk et al. | |
| 2020/0233397 A1 * | 7/2020 | Bello ................ | G05B 19/4184 |

* cited by examiner

DETECTING OR PREDICTING SYSTEM FAULTS IN COOLING SYSTEMS IN A NON-INTRUSIVE MANNER USING DEEP LEARNING

TECHNICAL FIELD

The present invention relates generally to cooling systems, such as two-phase cooling systems, and more particularly to detecting or predicting system faults in cooling systems in a non-intrusive manner using deep learning.

BACKGROUND

A cooling system is utilized to remove and dissipate heat, such as from high-power heat sources, such as high-power density transformers, inverters, converters, batteries, power electronics, etc. Such cooling systems may implement single-phase cooling, which may involve pumping liquid coolant through a cold plate which is attached to the heat source being cooled. The temperature of the liquid coolant increases as it passes through the cold plate, absorbing and storing the heat in its sensible heat capacity. Single-phase cooling is commonly used today in automotive systems and power electronic equipment.

Cooling systems may also implement two-phase cooling, which is generally used to remove and dissipate heat from high-power heat sources, such as electronics and lasers, or when the thermal energy needs to be transferred a significant distance between the heat source and the heat sink.

In two-phase cooling systems, heat may be transferred by the evaporation and condensation of a portion or all of the working fluid. Typically, a liquid near saturation is pumped into the cold plate, where it starts to boil, cooling the electronics and storing the energy in the latent heat of the fluid. The two-phase (liquid and vapor) fluid then flows to the condenser, where the heat is removed, condensing the vapor, so that a single-phase (liquid) exits the condenser, and the cycle repeats.

Heat transfer modes (manner of transferring heat) in such two-phase cooling systems include evaporation (type of vaporization that occurs on the surface of a liquid as it changes into the gas phase), pool boiling (boiling from a heated surface submerged in a large volume of stagnant liquid), flow boiling (occurs when a fluid circulates over a heated surface by external means such as a pump or due to the natural buoyancy effect), etc. Such two-phase heat transfer modes have much higher cooling capacities but are limited by a variety of system faults or instabilities, e.g., critical heat flux, flow maldistribution, flow reversal, etc. Critical heat flux describes the thermal limit of a phenomenon where a phase change occurs during heating, such as bubbles forming on a metal surface used to heat water, which suddenly decreases the efficiency of heat transfer, thus causing localized overheating of the heating surface. Flow maldistribution is the nonuniform distribution of the mass flow rate on one or more fluid sides, such as in a heat exchanger core. Flow reversal refers to the point at which the liquid begins to creep below the injection point.

Such system faults or instabilities are often triggered suddenly during normal operation. If not identified and mitigated in time, such system faults or instabilities can lead to overheating issues and detrimental device failures. For example, when critical heat flux is triggered during pool boiling, the device temperatures can ramp up in the order of 150° C./min.

Unfortunately, there is not currently a means for effectively detecting or predicting such system faults or instabilities in cooling systems.

SUMMARY

In one embodiment of the present disclosure, a computer-implemented method for detecting or predicting system faults in cooling systems comprises building and training a model to identify or predict a system fault in a cooling system based on acoustic emission signals in a temporal domain and a frequency domain. The method further comprises receiving acoustic emission signals from the cooling system in a temporal domain. The method additionally comprises converting the acoustic emission signals from the temporal domain to a frequency domain. Furthermore, the method comprises detecting or predicting a system fault in the cooling system using the trained model based on the acoustic emission signals received from the cooling system in the temporal and frequency domains.

Other forms of the embodiment of the computer-implemented method described above are in a system and in a computer program product.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present invention can be obtained when the following detailed description is considered in conjunction with the following drawings, in which.

DETAILED DESCRIPTION

Figure 1:
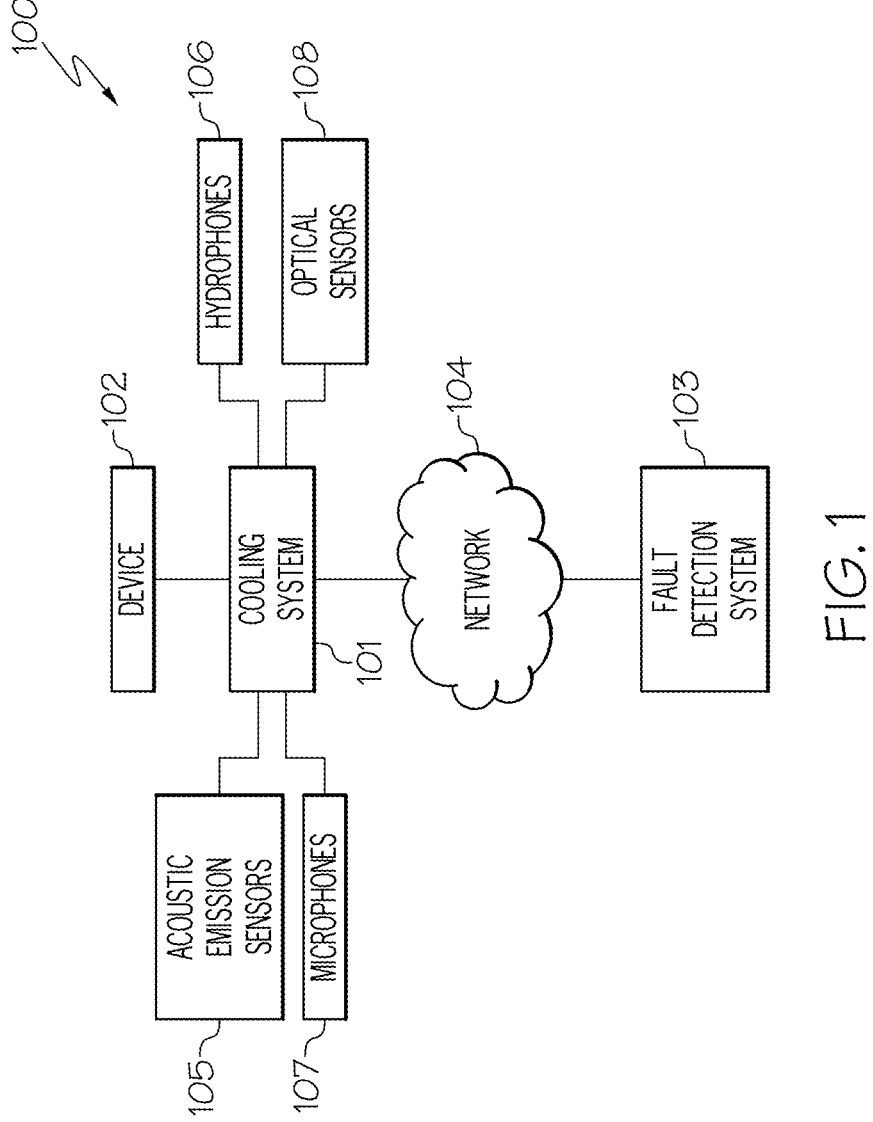
FIG. 1 illustrates a system for practicing the principles of the present disclosure in accordance with an embodiment of the present disclosure.

As stated in the Background section, a cooling system may implement two-phase cooling, which is generally used to remove and dissipate heat from high-power heat sources, such as electronics and lasers, or when the thermal energy needs to be transferred a significant distance between the heat source and the heat sink.

In two-phase cooling systems, heat may be transferred by the evaporation and condensation of a portion or all of the working fluid. Typically, a liquid near saturation is pumped into the cold plate, where it starts to boil, cooling the electronics and storing the energy in the latent heat of the fluid. The two-phase (liquid and vapor) fluid then flows to the condenser, where the heat is removed, condensing the vapor, so that a single-phase (liquid) exits the condenser, and the cycle repeats.

Heat transfer modes (manner of transferring heat) in such two-phase cooling systems include evaporation (type of vaporization that occurs on the surface of a liquid as it changes into the gas phase), pool boiling (boiling from a heated surface submerged in a large volume of stagnant liquid), flow boiling (occurs when a fluid circulates over a heated surface by external means such as a pump or due to the natural buoyancy effect), etc. Such two-phase heat transfer modes have much higher cooling capacities but are limited by a variety of system faults or instabilities, e.g., critical heat flux, flow maldistribution, flow reversal, etc. Critical heat flux describes the thermal limit of a phenomenon where a phase change occurs during heating, such as bubbles forming on a metal surface used to heat water, which suddenly decreases the efficiency of heat transfer, thus causing localized overheating of the heating surface. Flow maldistribution is the nonuniform distribution of the mass flow rate on one or more fluid sides, such as in a heat exchanger core. Flow reversal refers to the point at which the liquid begins to creep below the injection point.

Such system faults or instabilities are often triggered suddenly during normal operation. If not identified and mitigated in time, such system faults or instabilities can lead to overheating issues and detrimental device failures. For example, when critical heat flux is triggered during pool boiling, the device temperatures can ramp up in the order of 150° C./min.

Unfortunately, there is not currently a means for effectively detecting or predicting such system faults or instabilities in cooling systems.

The embodiments of the present disclosure provide a means for detecting or predicting system faults (e.g., a boiling crisis, a critical heat flux, a flow maldistribution, a flow reversal) in cooling systems by building and training a model (e.g., deep learning model) to detect or predict a system fault based on acoustic emission signals and/or imaging signals. In one embodiment, such acoustic emission signals are obtained from the cooling system using acoustic emission sensors, hydrophones and/or microphones. Furthermore, in one embodiment, such acoustic emission signals are in a temporal domain and converted into the frequency domain. In one embodiment, imaging signals are obtained from the cooling system using optical sensors (e.g., high-speed cameras). In one embodiment, the model leverages a first model architecture (e.g., convolutional neural network) for extracting features from the imaging signals and a second model architecture (e.g., recurrent neural network) for extracting features from the acoustic emission signals in the temporal and frequency domains. The features extracted from the imaging signals and acoustic emission signals may be fused by concatenating the output layer of the first and second model architectures, such as by using non-volume preserving-based fusion. In this manner, system faults may be detected or predicted in a non-intrusive manner by utilizing sensors that do not interfere with the functionality of the cooling system. Furthermore, system faults may be detected or predicted in a more accurate and effective manner by using deep learning models based on multimodal signals (e.g., imaging signals and acoustic emission signals) as opposed to a single modality of signals, in which the features extracted from the multimodal signals are fused together using non-volume preserving-based fusion to improve accuracy. A further discussion regarding these and other features is provided below.

In some embodiments of the present disclosure, the present disclosure comprises a computer-implemented method, system and computer program product for detecting or predicting system faults in cooling systems. In one embodiment of the present disclosure, a model (deep learning model) is built and trained to detect or predict system faults in a cooling system based on acoustic emission signals (both in temporal and frequency domains) and/or imaging signals. Upon training the model to detect or predict system faults in a cooling system, acoustic emission signals may be obtained non-intrusively from the cooling system using acoustic emission sensors, hydrophones and/or microphones. In one embodiment, such obtained acoustic emission signals are in a temporal domain. In such an embodiment, the acoustic emission signals are converted from the temporal domain to the frequency domain, such as by performing a Fourier transformation. Additionally, upon training the model to detect or predict system faults in a cooling system, imaging signals (e.g., boiling images) may be obtained non-intrusively from the cooling system using optical sensors (e.g., high-speed cameras). The trained model may then detect or predict a system fault in the cooling system based on such information (acoustic emission signals, including in temporal and frequency domains, and/or the imaging signals). Furthermore, in one embodiment, system faults may be detected or predicted in a more accurate and effective manner by using deep learning models based on multimodal signals (e.g., imaging signals and acoustic emission signals) as opposed to a single modality of signals, in which the features extracted from the multimodal signals are fused together using non-volume preserving-based fusion to improve accuracy. As a result, system faults in a cooling system are detected or predicted in a more accurate and effective manner.

In the following description, numerous specific details are set forth to provide a thorough understanding of the present disclosure. However, it will be apparent to those skilled in the art that the present disclosure may be practiced without such specific details. In other instances, well-known circuits have been shown in block diagram form in order not to obscure the present disclosure in unnecessary detail. For the most part, details considering timing considerations and the like have been omitted inasmuch as such details are not necessary to obtain a complete understanding of the present disclosure and are within the skills of persons of ordinary skill in the relevant art.

Referring now to the Figures in detail, FIG. 1 illustrates an embodiment of the present disclosure of a system 100 for practicing the principles of the present disclosure. System 100 includes a cooling system 101 configured to remove and dissipate heat from a device 102, such as high power heat sources. Examples of device 102 include, but not limited to, high-power density transformers, inverters, converters, batteries, power electronics, etc. In one embodiment, device 102 corresponds to wide bandgap semiconductors in which the purpose of cooling system 101 is to mitigate the inter-pulse instability in power amplifiers (e.g., GaN power amplifiers) in radar systems. In one embodiment, device 102 corresponds to a nuclear power plant in which the purpose of cooling system 101 is to perform real-time detection of the departure from nucleate boiling so as to effectively avoid overheating issues of the fuel claddings.

Furthermore, as shown in FIG. 1, system 100 includes a fault detection system 103 connected to cooling system 101 via a network 104. In one embodiment, fault detection system 103 is configured to detect or predict system faults in cooling system 101. "System faults" (also referred to as instabilities), as used herein, refer to a malfunction or error such that cooling system 101 is unable to correctly perform its function, namely, removing and dissipating heat from device 102. Examples of system faults include, but not limited to, a boiling crisis, a critical heat flux, a flow maldistribution, a flow reversal, etc.

Boiling crisis, as used herein, refers to the rapid formation of the quasi-continuous vapor film between the heater and the liquid when the heat supply exceeds a critical value. Critical heat flux, as used herein, describes the thermal limit of a phenomenon where a phase change occurs during heating, such as bubbles forming on a metal surface used to heat water, which suddenly decreases the efficiency of heat transfer, thus causing localized overheating of the heating surface. Flow maldistribution, as used herein, refers to the nonuniform distribution of the mass flow rate on one or more fluid sides, such as in a heat exchanger core. Flow reversal, as used herein, refers to the point at which the liquid begins to creep below the injection point.

In one embodiment, fault detection system 103 detects or predicts system faults in cooling system 101 in a non-intrusive manner by utilizing sensors that do not interfere with the functioning of cooling system 101. In one embodiment, fault detection system 103 obtains acoustic emission signals and/or imaging signals from cooling system 101 which are utilized by fault detection system 103 to detect or predict a system fault in cooling system 101 as discussed further below.

In one embodiment, acoustic emission signals are obtained from cooling system 101 using one or more acoustic emission sensors 105, one or more hydrophones 106 and one or more microphones 107. In one embodiment, such acoustic emission signals are in the form of sound pressure. An acoustic emission sensor 105, as used herein, refers to a sensor that detects acoustic emission, such as the phenomenon of radiation of acoustic (elastic) waves in solids that occurs when a material undergoes irreversible changes in its internal structure. In one embodiment, such acoustic emission sensors 105 are in contact with cooling system 101. A hydrophone 106, as used herein, refers to a type of microphone designed to be used underwater (e.g., underwater in a boiling chamber of cooling system 101) for recording or listening to underwater sound. A microphone 107, as used herein, refers to a transducer that converts sound into an electrical signal. In one embodiment, microphone 107 corresponds to a condenser microphone, which may be placed remotely to cooling system 101. In one embodiment, microphone 107 implements a filter to remove noise from sounds captured by microphone 107. For example, a high-pass or a low-pass filter may be utilized to remove noise from the captured sounds. For example, a high-pass filter (e.g., Butterworth high-pass filter) may pass microphone signals with a frequency higher than a certain cutoff frequency and attenuate microphone signals with frequencies lower than the cutoff frequency. A low-pass filter may pass microphone signals with a frequency lower than a selected cutoff frequency and attenuate microphone signals with frequencies higher than the cutoff frequency.

In one embodiment, fault detection system 103 detects or predicts system faults in cooling system 101 in a non-intrusive manner by utilizing imaging signals from one or more optical sensors 108, such as high-speed cameras. In one embodiment, such optical sensors 108 are utilized to obtain images of cooling system 101, such as the boiling chamber of cooling system 101. In one embodiment, such optical sensors 108 may correspond to a high-speed camera using differentially enhanced compressed ultrafast photography (Diff-CUP).

Upon obtaining such acoustic emission signals and imaging signals, fault detection system 103 may utilize a model to detect or predict a system fault in cooling system 101. In one embodiment, such acoustic emission signals are received in the temporal domain. In one embodiment, acoustic emission signals are converted from the temporal domain to the frequency domain. In one embodiment, fault detection system 103 converts the acoustic emission signals from the temporal domain to the frequency domain by performing the Fourier transformation on the acoustic emission signals from the temporal domain. In one embodiment, fault detection system 103 utilizes various software tools for performing the Fourier transformation, including, but not limited to, Matlab®, FFTPACK, etc.

In one embodiment, fault detection system 103 builds and trains a model (e.g., deep learning model) to detect or predict system faults in cooling systems based on the acoustic emission signals and/or imaging signals as discussed further below. In one embodiment, such a model (e.g., deep learning model) may be used by fault detection system 103 to determine if a system fault is detected in cooling system 101 or is predicted to occur in cooling system 101 based on the acoustic emission signals and/or imaging signals received by fault detection system 103.

In one embodiment, fault detection system 103 implements a remedial or a preventive measure based on the detected or predicted system fault. In one embodiment, fault detection system 103 utilizes a data structure (e.g., table) that includes a listing of remedial/preventive measures based on the detected/predicted system faults. In one embodiment, fault detection system 103 searches such a data structure for the system fault detected or predicted by the model, such as by using natural language processing. Upon identifying a matching system fault, the associated remedial or preventive measure may be obtained from the data structure and later implemented by fault detections system 103. For example, the detected system fault of a thermal failure (e.g., heat flux exceeding a threshold limit) may be associated with the remedial action of cooling device 102, such as turning off the heater. In another example, the predicted system fault of overheating or overcooling (e.g., heat flux approaching a threshold limit within a user-designated $W/cm^2$) may be associated with the preventive measure of preventing the overheating or overcooling, respectively, of device 102. In one embodiment, such a data structure is populated by an expert. In one embodiment, the data structure resides in the storage device of fault detection system 103.

A further discussion regarding such features is provided below.

A description of the software components of fault detection system 103 used for detecting or predicting system faults in cooling system 101 is provided below in connection with FIG. 2. A description of the hardware configuration of fault detection system 103 is provided further below in connection with FIG. 9.

As previously discussed, in one embodiment, fault detection system 103 is connected to cooling system 101 via network 104. Network 104 may be, for example, a local area network, a wide area network, a wireless wide area network, a circuit-switched telephone network, a Global System for Mobile Communications (GSM) network, a Wireless Application Protocol (WAP) network, a WiFi network, an IEEE 802.11 standards network, various combinations thereof, etc. Other networks, whose descriptions are omitted here for brevity, may also be used in conjunction with system 100 of FIG. 1 without departing from the scope of the present disclosure.

System 100 is not to be limited in scope to any one particular network architecture. System 100 may include any number of cooling systems 101, devices 102, fault detection systems 103, networks 104, acoustic emission sensors 105, hydrophones 106, microphones 107 and optical sensors 108.

A discussion regarding the software components used by fault detection system 103 for detecting or predicting system faults in a cooling system (e.g., cooling system 101) is provided below in connection with FIG. 2

Figure 2:
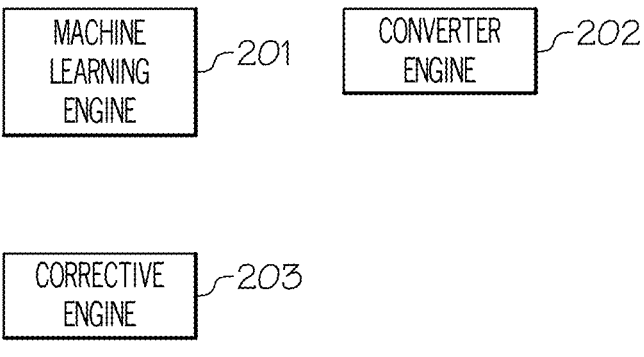
FIG. 2 is a diagram of the software components used by the fault detection system for detecting or predicting system faults in a cooling system in accordance with an embodiment of the present disclosure.

FIG. 2 is a diagram of the software components used by fault detection system 103 for detecting or predicting system faults in a cooling system (e.g., cooling system 101) in accordance with an embodiment of the present disclosure.

Referring to FIG. 2, in conjunction with FIG. 1, fault detection system 103 includes a machine learning engine 201 configured to create or build and train a model (e.g., deep learning model) to detect or predict system faults in cooling systems, such as cooling system 101.

In one embodiment, the model is trained to detect or predict system faults in cooling systems, such as cooling system 101, by utilizing features from historical information pertaining to the relationship of system faults (e.g., thermal failures) of cooling systems and acoustic emission signals (both in temporal domain and frequency domain) as well as the relationship of system faults (e.g., thermal faults) of cooling systems and imaging signals. Such relationships may be established via experimentation by an expert, such as shown in FIG. 3.

Figure 3:
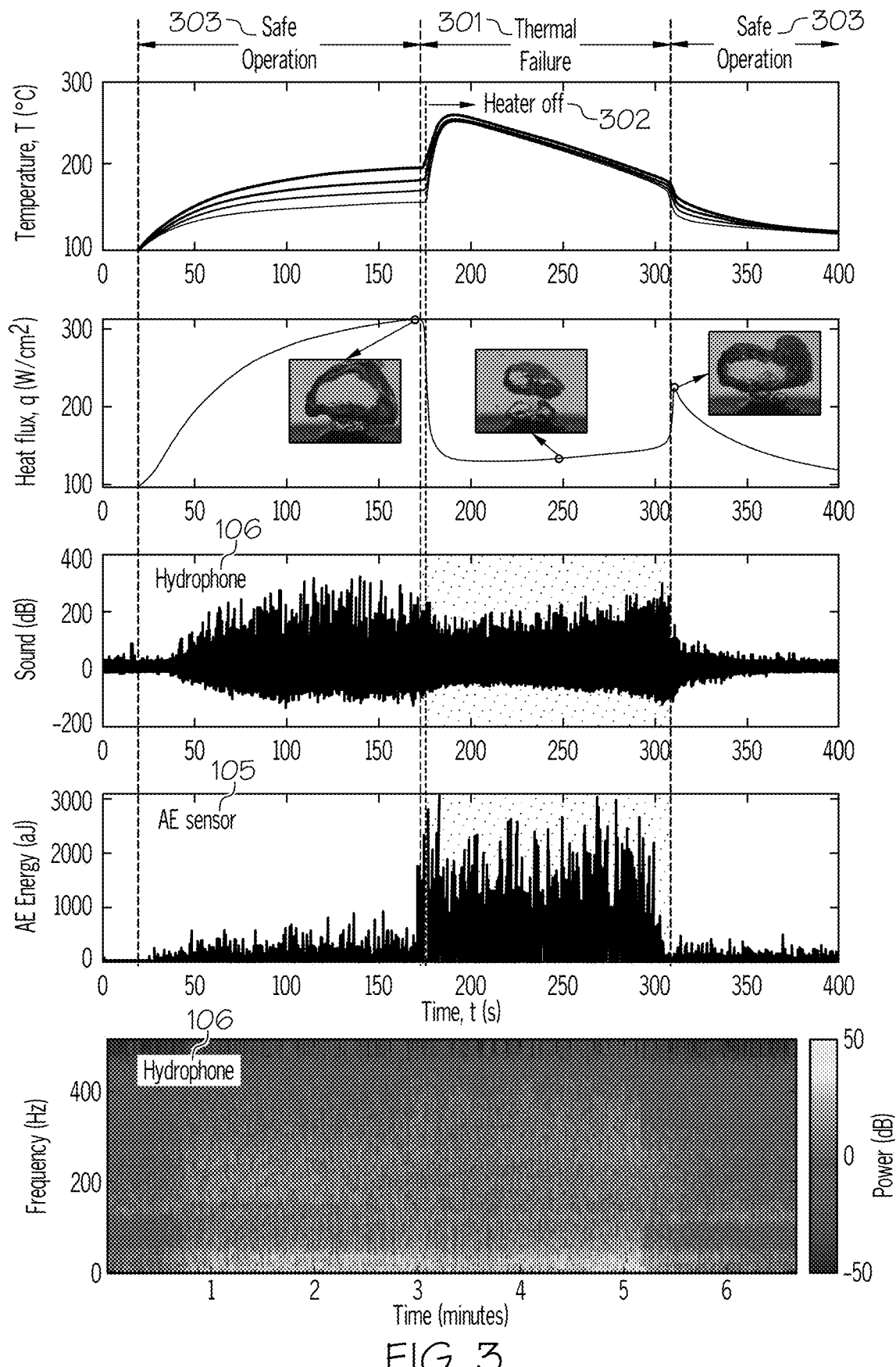
FIG. 3 illustrates a relationship between system faults of cooling systems and acoustic emission signals obtained from the cooling systems in accordance with an embodiment of the present disclosure.

Referring to FIG. 3, FIG. 3 illustrates a relationship between system faults of cooling systems, such as a thermal failure resulting from heat flux exceeding a threshold limit (e.g., 200 W/cm$^2$), and acoustic emission signals obtained from the cooling systems in accordance with an embodiment of the present disclosure.

As shown in FIG. 3, when heat flux, q, exceeds a threshold of around 200 W/cm$^2$, a thermal failure 301 may be said to occur. In response to such a thermal failure 301, a heater may be turned off 302 thereby resulting in a safe operation 303 of the cooling system, such as cooling system 101.

As further shown in FIG. 3, heat flux, q, is calculated using temperatures (which may be obtained from temperature sensors placed at or near the cooling system, such as cooling system 101) using Fourier's law. As further shown in FIG. 3, acoustic emission signals obtained from the cooling system, such as cooling system 101, via hydrophones, such as hydrophones 106, may be represented in terms of sound (decibels) versus time (seconds). Furthermore, as shown in FIG. 3, acoustic emission signals obtained from the cooling system via acoustic emission sensors, such as acoustic emission sensors 105, may be represented in terms of energy (aJ) versus time (seconds). In one embodiment, such acoustic emission signals, such as those received from hydrophones (e.g., hydrophones 106), are in the temporal domain. Such signals in the temporal domain may be converted by converter engine 202 to the frequency domain (Hertz, Hz), such as in the form of a spectrogram, by performing the Fourier transformation on the acoustic emission signals from the temporal domain as discussed above. Such acoustic emission signals in the frequency domain may be represented in terms of frequency (Hz) and power (dB) versus time (minutes). In one embodiment, converter engine 202 utilizes various software tools for performing the Fourier transformation, including, but not limited to, Matlab®, FFTPACK, etc.

When system faults (e.g., thermal failures) of cooling systems, such as cooling system 101, are detected to occur, the particular features of the sound, acoustic emission (AE) energy and frequency of the acoustic emission signals may be identified as shown in FIG. 3 thereby providing a relationship between the acoustic emission signals and system faults.

Figure 4A:
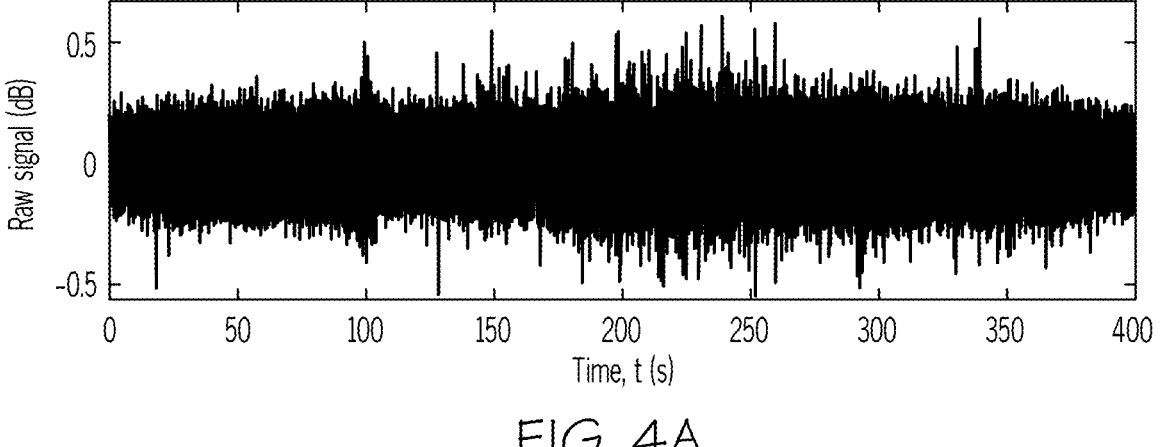
FIGS. 4A-4B illustrate a relationship between system faults and the features of acoustic emission signals from microphones before and after filtering background noise in accordance with an embodiment of the present disclosure.
Figure 4B:
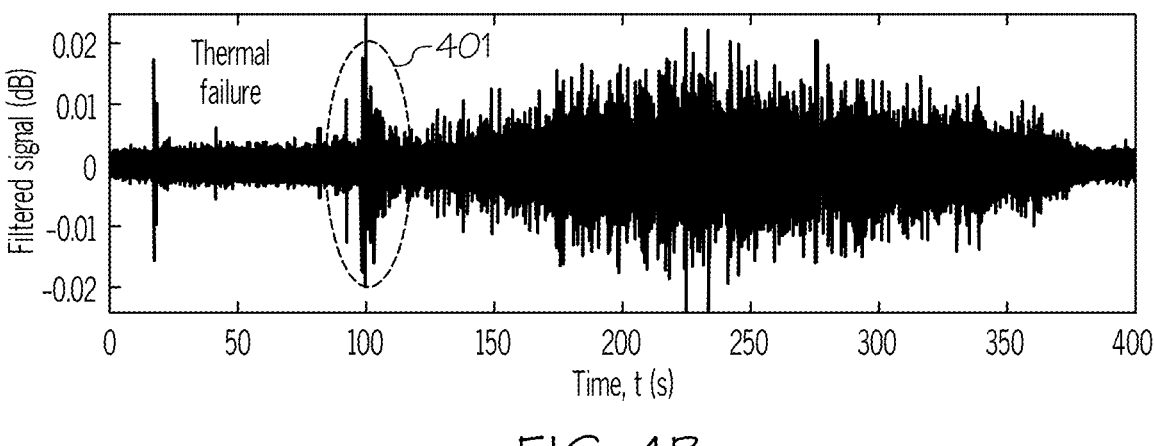

Furthermore, in one embodiment, the acoustic signals from microphones, such as microphone 107, may also be utilized to determine the relationship between system faults and acoustic emission signals as shown in FIGS. 4A-4B.

FIGS. 4A-4B illustrates a relationship between system faults, such as a thermal failure resulting from heat flux exceeding a threshold limit (e.g., 200 W/cm$^2$), and the features of acoustic emission signals from microphones, such as microphone 107, before and after filtering background noise in accordance with an embodiment of the present disclosure. FIG. 4A is a graph of the sound (dB) measured by a microphone, such as microphone 107, placed in the vicinity of a cooling system (e.g., cooling system 101) versus time (seconds) before filtering the background noise. FIG. 4B is a graph of the sound (dB) measured by a microphone, such as microphone 107, placed in the vicinity of a cooling system (e.g., cooling system 101) versus time (seconds) after filtering the background noise.

In one embodiment, the background noise in the sounds captured by microphones, such as microphone 107, may be significant thereby making it difficult to determine the relationship between the acoustic emission signal outputted by the microphone, such as microphone 107, and the system fault of the cooling system (e.g., cooling system 101). As a result, a microphone, such as microphone 107, implements a filter to remove noise from sounds captured by microphone 107. For example, a high-pass or a low-pass filter may be utilized to remove noise from the microphone signals. For example, a high-pass filter (e.g., Butterworth high-pass filter) may pass microphone signals with a frequency higher than a certain cutoff frequency and attenuate microphone signals with frequencies lower than the cutoff frequency. A low-pass filter may pass microphone signals with a frequency lower than a selected cutoff frequency and attenuate microphone signals with frequencies higher than the cutoff frequency.

As shown in FIG. 4B, a thermal failure 401 corresponds to a spike in the acoustic emission signal provided by the microphone, such as microphone 107, which occurred at a time of around 100 seconds. As a result, features of the acoustic emission signal provided by the microphone may be learned when system faults of the cooling systems occur.

Furthermore, as discussed above, acoustic frequency analysis may be utilized for thermal failure detection. For example, the acoustic emission signals in the temporal domain are converted to the frequency domain. A relationship between the features of the acoustic emission signals in the frequency domain and system faults of cooling systems may be determined as shown in FIG. 5.

Figure 5:
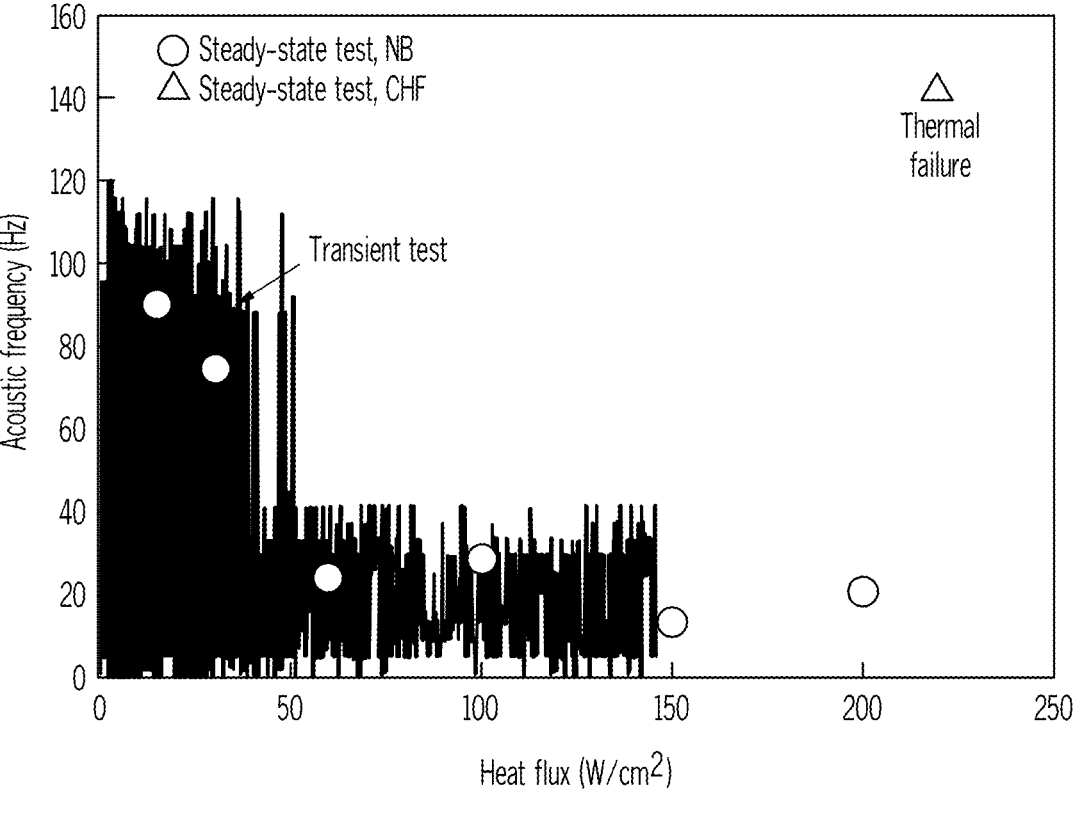
FIG. 5 is a graph illustrating the relationship between the features of the acoustic frequency of the acoustic emission signals and heat flux in accordance with an embodiment of the present disclosure.

FIG. 5 is a graph illustrating the relationship between the features of the acoustic frequency of the acoustic emission signals and heat flux in accordance with an embodiment of the present disclosure.

As shown in FIG. 5, a steady-state test was conducted for nucleate boiling (NB) and for critical heat flux (CHF). In one embodiment, the acoustic frequency is analyzed for both transient and steady-state boiling tests to identify the key acoustic features of safe operation (e.g., nucleate boiling) and thermal failure (e.g., critical heat flux).

Nucleate boiling, as used herein, refers to a type of boiling that takes place when the surface temperature is hotter than the saturated fluid temperature by a certain amount but where the heat flux is below the critical heat flux. Critical heat flux, as used herein, describes the thermal limit of a phenomenon where a phase change occurs during heating, such as bubbles forming on a metal surface used to heat water, which suddenly decreases the efficiency of heat transfer, thus causing localized overheating of the heating surface.

Based on such information provided in the graph, a relationship between the acoustic emission signals in the frequency domain and system faults of cooling systems (e.g., cooling system 101) may be determined.

Figure 6:
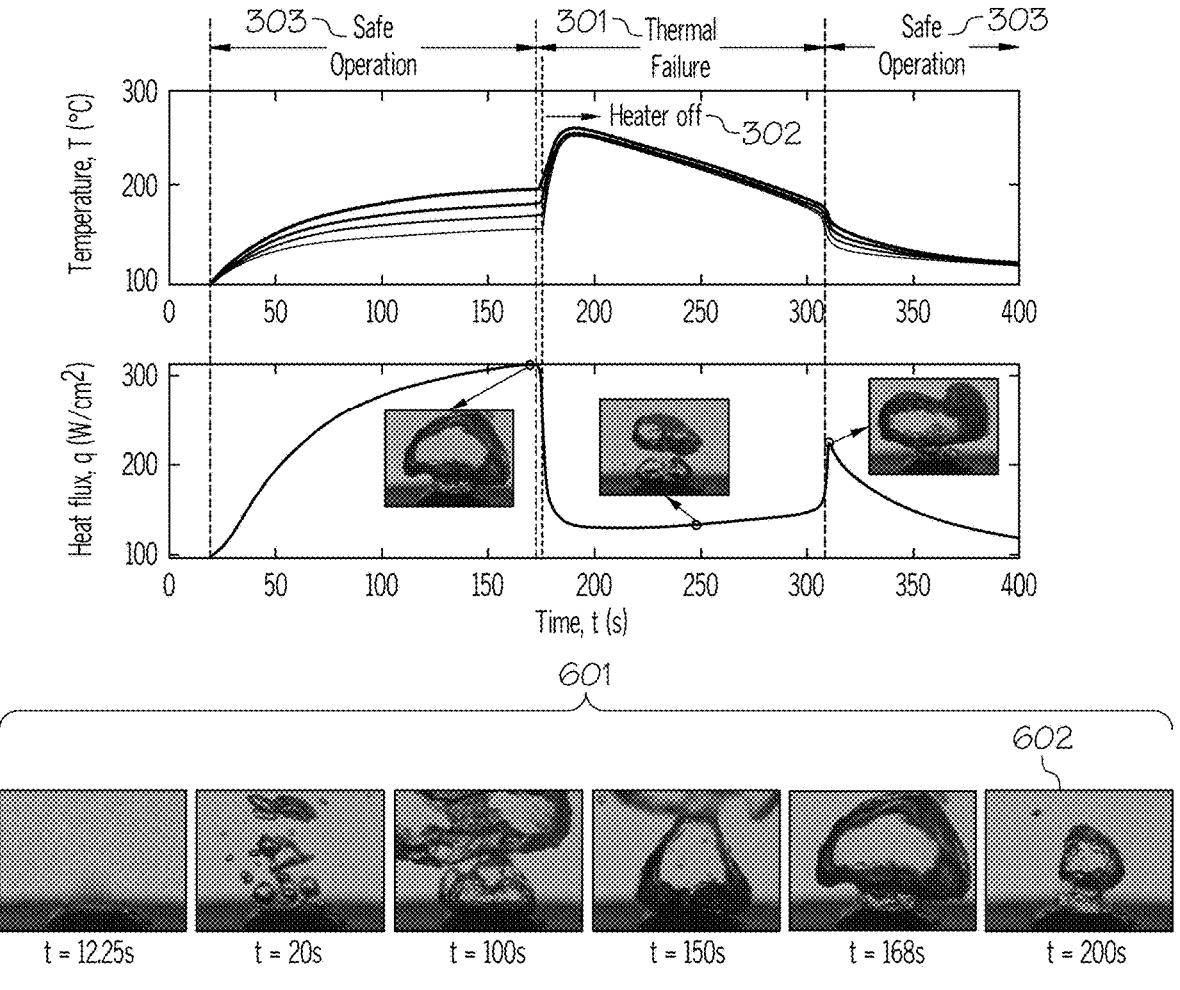
FIG. 6 illustrates a relationship between system faults and the features of imaging signals in accordance with an embodiment of the present disclosure.

In a similar manner, a relationship between the features of imaging signals, such as boiling images (images in boiling chamber), and system faults, such as a thermal failure resulting from heat flux exceeding a threshold limit (e.g., 200 W/cm²), may be determined as shown in FIG. 6.

FIG. 6 illustrates a relationship between system faults, such as a thermal failure resulting from heat flux exceeding a threshold limit (e.g., 200 W/cm²), and the features of imaging signals (e.g., boiling images at 200 Hz) in accordance with an embodiment of the present disclosure.

As shown in FIG. 6, a relationship between boiling images 601 and thermal failure 301 may be determined based on identifying the images 601 that transpired when a thermal failure 301 occurred, such as at a time that corresponds to 200 seconds. For example, image 602 represents a boiling image taken at a time corresponding to 200 seconds. Such an image may be associated with a system fault, such as thermal failure 301, which occurred at a time corresponding to 200 seconds.

In one embodiment, such information (acoustic emission signals from the temporal and frequency domains when system faults occur and imaging signals when system faults occur) discussed above may be utilized by machine learning engine 201 to train the model to detect or predict a system fault in cooling system 101.

In one embodiment, machine learning engine 201 uses a machine learning algorithm (e.g., supervised learning) to build the model to detect or predict a system fault in a cooling system, such as cooling system 101, using a sample data set containing historical information (acoustic emission signals from the temporal and frequency domains when system faults occur and imaging signals when system faults occur) pertaining to system faults in cooling systems.

Such a sample data set is referred to herein as the "training data," which is used by the machine learning algorithm to detect or predict a system fault in a cooling system. The algorithm iteratively makes predictions on the training data as to the detection or prediction of a system fault in a cooling system until the predictions achieve the desired accuracy as determined by an expert. Examples of such learning algorithms include nearest neighbor, Naïve Bayes, decision trees, linear regression, support vector machines and neural networks.

After such a model is trained, it may be utilized to detect or predict a system fault in cooling system 101 using current acoustic emission signals and/or imaging signals obtained from acoustic emission sensors 105, hydrophones 106, microphones 107 and/or optical sensors 108.

Figure 7:
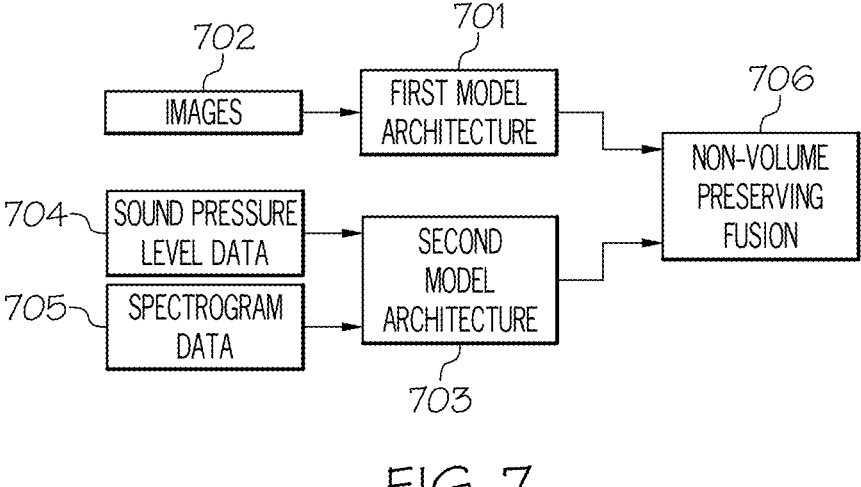
FIG. 7 illustrates a two model architecture to extract features from acoustic emission signals and imaging signals in accordance with an embodiment of the present disclosure.

In one embodiment, machine learning engine 201 leverages a two model architecture to extract features from acoustic emission signals and imaging signals as shown in FIG. 7.

FIG. 7 illustrates a two model architecture to extract features from acoustic emission signals and imaging signals in accordance with an embodiment of the present disclosure.

Referring to FIG. 7, machine learning engine 201 leverages a first model architecture 701 (e.g., convolutional neural network) to extract features from imaging signals, such as boiling images 702, such as when system faults occur in cooling systems. In one embodiment, machine learning engine 201 leverages a second model architecture 703 (e.g., recurrent neural network) to extract features from acoustic emission signals, such as sound pressure level data 704 (acoustic emission signals in the time domain) and spectrogram data 705 (acoustic emission signals in the frequency domain).

In one embodiment, the features extracted from the imaging signals and acoustic emission signals may be fused by concatenating the output layer of the first and second model architectures 701, 703, such as by using non-volume preserving-based fusion 706. Non-volume preserving-based fusion, as used herein, refers to features from the output layer of the first and second model architectures 701, 703 being efficiently fused via a non-linear process with multiple-level convolutional neural network-based fusion units.

In this manner, system faults may be detected or predicted in a more accurate and effective manner by using deep learning models based on multimodal signals (e.g., imaging signals and acoustic emission signals) as opposed to a single modality of signals, in which the features extracted from the multimodal signals may be fused together using non-volume preserving-based fusion to improve accuracy.

Referring again to FIG. 2, fault detection system 103 further includes a corrective engine 203 configured to implement a remedial or a preventive measure based on the detected or predicted system fault. In one embodiment, corrective engine 203 utilizes a data structure (e.g., table) that includes a listing of remedial/preventive measures based on the detected/predicted system faults. In one embodiment, corrective engine 203 searches such a data structure for the system fault detected or predicted by the model, such as by using natural language processing. Upon identifying a matching system fault, the associated remedial or preventive measure may be obtained from the data structure and later implemented by corrective engine 203. For example, the detected system fault of a thermal failure (e.g., heat flux exceeding a threshold limit) may be associated with the remedial action of cooling device 102, such as turning off the heater. In another example, the predicted system fault of overheating or overcooling (e.g., heat flux approaching a threshold limit within a user-designated W/cm$^2$) may be associated with the preventive measure of preventing the overheating or overcooling, respectively, of device 102. In one embodiment, such a data structure is populated by an expert. In one embodiment, the data structure resides in the storage device of fault detection system 103.

Figure 8:
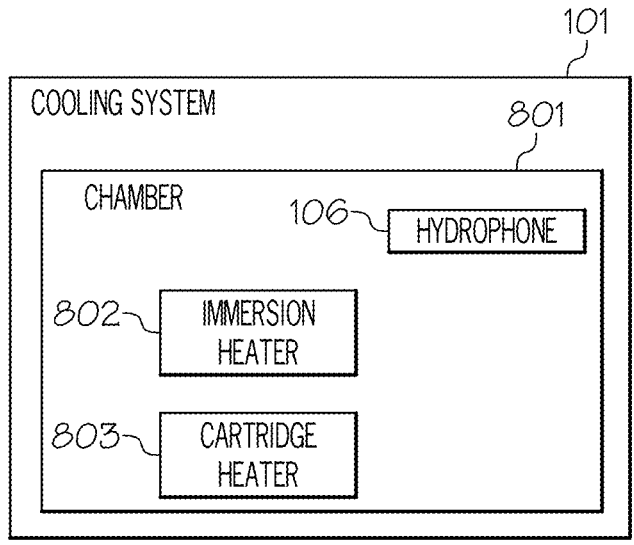
FIG. 8 illustrates a chamber of the cooling system in accordance with an embodiment of the present disclosure.

In one embodiment, corrective engine 203 instructs elements (e.g., immersion heaters, cartridge heaters) of cooling system 101 to be turned off or to adjust the heat capacity (e.g., increase or decrease) produced by such heaters, such as shown in FIG. 8.

FIG. 8 illustrates a chamber 801 of cooling system 101 in accordance with an embodiment of the present disclosure.

As shown in FIG. 8, chamber 801 includes a hydrophone 106 as well as an immersion heater 802 and a cartridge heater 803. An "immersion heater 802," as used herein, refers to an electric water heater that is found inside a hot water cylinder. A "cartridge heater 803," as used herein, refers to a tube-shaped, industrial Joule heating element.

In one embodiment, immersion heater 802, cartridge heater 803 are controlled via instructions from corrective engine 203, such as increasing or decreasing the heat capacity or being turned off.

A further description of these and other features is provided below in connection with the discussion of the method for detecting or predicting system faults in a cooling system.

Prior to the discussion of the method for detecting or predicting system faults in a cooling system, a description of the hardware configuration of fault detection system 103 (FIG. 1) is provided below in connection with FIG. 9.

Figure 9:
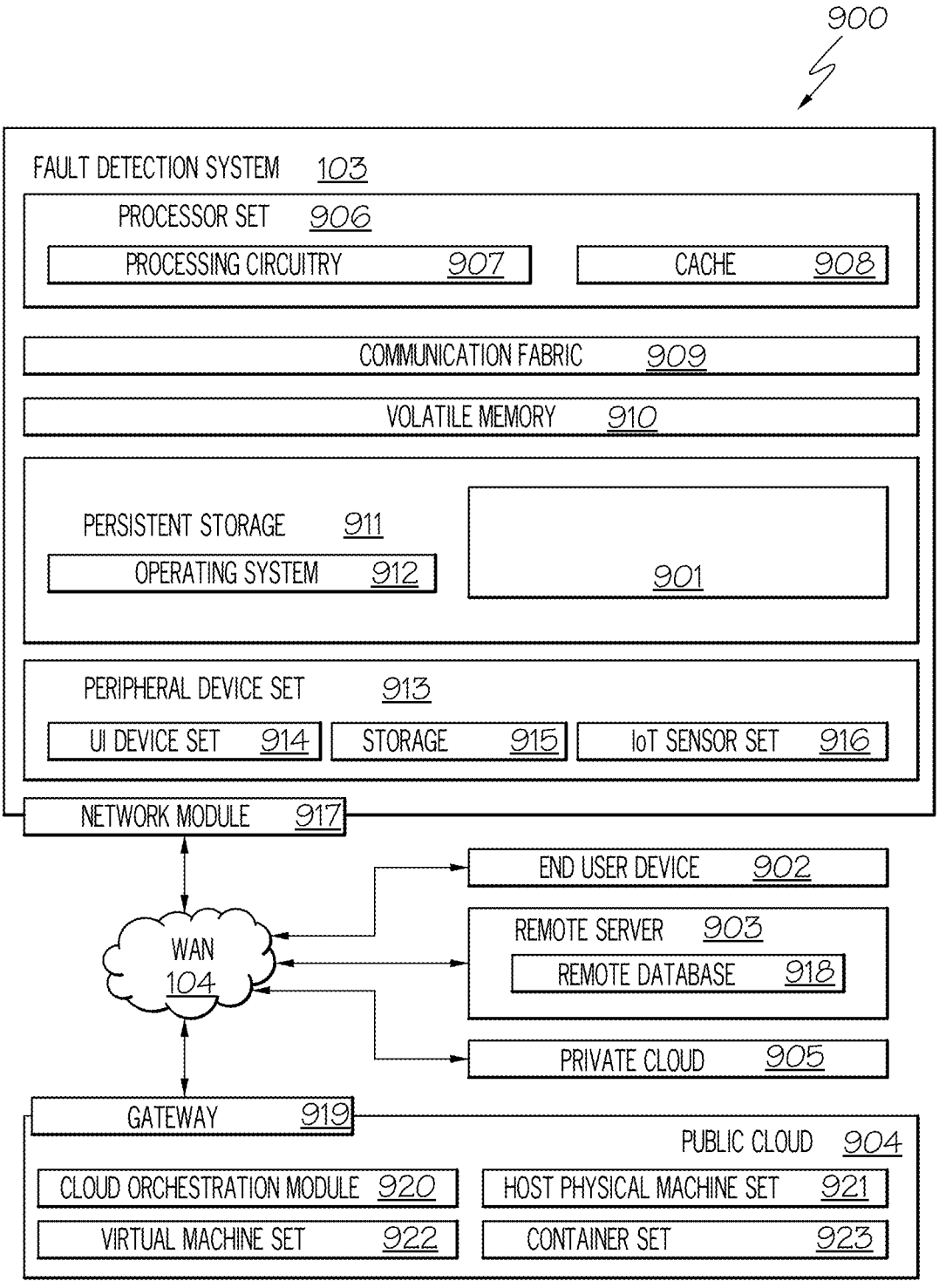
FIG. 9 illustrates an embodiment of the present disclosure of the fault detection system which is representative of a hardware environment for practicing the present disclosure.

Referring now to FIG. 9, in conjunction with FIG. 1, FIG. 9 illustrates an embodiment of the present disclosure of the fault detection system 103 which is representative of a hardware environment for practicing the present disclosure.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 900 contains an example of an environment for the execution of at least some of the computer code involved in performing the inventive methods, such as detecting or predicting system faults in cooling systems. In addition to block 901, computing environment 900 includes, for example, fault detection system 103, network 104, such as a wide area network (WAN), end user device (EUD) 902, remote server 903, public cloud 904, and private cloud 905. In this embodiment, fault detection system 103 includes processor set 906 (including processing circuitry 907 and cache 908), communication fabric 909, volatile memory 910, persistent storage 911 (including operating system 912 and block 901, as identified above), peripheral device set 913 (including user interface (UI) device set 914, storage 915, and Internet of Things (IoT) sensor set 916), and network module 917. Remote server 903 includes remote database 918. Public cloud 904 includes gateway 919, cloud orchestration module 920, host physical machine set 921, virtual machine set 922, and container set 923.

Fault detection system 103 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 918. As is well understood in the art of computer technology, and depending upon the technology, performance of a computer-implemented method may be distributed among multiple computers and/or between multiple locations. On the other hand, in this presentation of computing environment 900, detailed discussion is focused on a single computer, specifically fault detection system 103, to keep the presentation as simple as possible. Fault detection system 103 may be located in a cloud, even though it is not shown in a cloud in FIG. 9. On the other hand, fault detection system 103 is not required to be in a cloud except to any extent as may be affirmatively indicated.

Processor set 906 includes one, or more, computer processors of any type now known or to be developed in the future. Processing circuitry 907 may be distributed over multiple packages, for example, multiple, coordinated integrated circuit chips. Processing circuitry 907 may implement multiple processor threads and/or multiple processor cores. Cache 908 is memory that is located in the processor chip package(s) and is typically used for data or code that should be available for rapid access by the threads or cores running on processor set 906. Cache memories are typically organized into multiple levels depending upon relative proximity to the processing circuitry. Alternatively, some, or all, of the cache for the processor set may be located "off chip."

In some computing environments, processor set 906 may be designed for working with qubits and performing quantum computing.

Computer readable program instructions are typically loaded onto fault detection system 103 to cause a series of operational steps to be performed by processor set 906 of fault detection system 103 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 908 and the other storage media discussed below. The program instructions, and associated data, are accessed by processor set 906 to control and direct performance of the inventive methods. In computing environment 900, at least some of the instructions for performing the inventive methods may be stored in block 901 in persistent storage 911.

Communication fabric 909 is the signal conduction paths that allow the various components of fault detection system 103 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 910 is any type of volatile memory now known or to be developed in the future. Examples include dynamic type random access memory (RAM) or static type RAM. Typically, the volatile memory is characterized by random access, but this is not required unless affirmatively indicated. In fault detection system 103, the volatile memory 910 is located in a single package and is internal to fault detection system 103, but, alternatively or additionally, the volatile memory may be distributed over multiple packages and/or located externally with respect to fault detection system 103.

Persistent Storage 911 is any form of non-volatile storage for computers that is now known or to be developed in the future. The non-volatility of this storage means that the stored data is maintained regardless of whether power is being supplied to fault detection system 103 and/or directly to persistent storage 911. Persistent storage 911 may be a read only memory (ROM), but typically at least a portion of the persistent storage allows writing of data, deletion of data and re-writing of data. Some familiar forms of persistent storage include magnetic disks and solid state storage devices. Operating system 912 may take several forms, such as various known proprietary operating systems or open source Portable Operating System Interface type operating systems that employ a kernel. The code included in block 901 typically includes at least some of the computer code involved in performing the inventive methods.

Peripheral device set 913 includes the set of peripheral devices of fault detection system 103. Data communication connections between the peripheral devices and the other components of fault detection system 103 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 914 may include components such as a display screen, speaker, microphone, wearable devices (such as goggles and smart watches), keyboard, mouse, printer, touchpad, game controllers, and haptic devices. Storage 915 is external storage, such as an external hard drive, or insertable storage, such as an SD card. Storage 915 may be persistent and/or volatile. In some embodiments, storage 915 may take the form of a quantum computing storage device for storing data in the form of qubits. In embodiments where fault detection system 103 is required to have a large amount of storage (for example, where fault detection system 103 locally stores and manages a large database) then this storage may be provided by peripheral storage devices designed for storing very large amounts of data, such as a storage area network (SAN) that is shared by multiple, geographically distributed computers. IoT sensor set 916 is made up of sensors that can be used in Internet of Things applications. For example, one sensor may be a thermometer and another sensor may be a motion detector.

Network module 917 is the collection of computer software, hardware, and firmware that allows fault detection system 103 to communicate with other computers through WAN 104. Network module 917 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 917 are performed on the same physical hardware device. In other embodiments (for example, embodiments that utilize software-defined networking (SDN)), the control functions and the forwarding functions of network module 917 are performed on physically separate devices, such that the control functions manage several different network hardware devices. Computer readable program instructions for performing the inventive methods can typically be downloaded to fault detection system 103 from an external computer or external storage device through a network adapter card or network interface included in network module 917.

WAN 104 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 902 is any computer system that is used and controlled by an end user (for example, a customer of an enterprise that operates fault detection system 103), and may take any of the forms discussed above in connection with fault detection system 103. EUD 902 typically receives helpful and useful data from the operations of fault detection system 103. For example, in a hypothetical case where fault detection system 103 is designed to provide a recommendation to an end user, this recommendation would typically be communicated from network module 917 of fault detection system 103 through WAN 104 to EUD 902. In this way, EUD 902 can display, or otherwise present, the recommendation to an end user. In some embodiments, EUD 902 may be a client device, such as thin client, heavy client, mainframe computer, desktop computer and so on.

Remote server 903 is any computer system that serves at least some data and/or functionality to fault detection system 103. Remote server 903 may be controlled and used by the same entity that operates fault detection system 103. Remote server 903 represents the machine(s) that collect and store helpful and useful data for use by other computers, such as fault detection system 103. For example, in a hypothetical case where fault detection system 103 is designed and programmed to provide a recommendation based on historical data, then this historical data may be provided to fault detection system 103 from remote database 918 of remote server 903.

Public cloud 904 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 904 is performed by the computer hardware and/or software of cloud orchestration module 920. The computing resources provided by public cloud 904 are typically implemented by virtual computing environments that run on various computers making up the computers of host physical machine set 921, which is the universe of physical computers in and/or available to public cloud 904. The virtual computing environments (VCEs) typically take the form of virtual machines from virtual machine set 922 and/or containers from container set 923. It is understood that these VCEs may be stored as images and may be transferred among and between the various physical machine hosts, either as images or after instantiation of the VCE. Cloud orchestration module 920 manages the transfer and storage of images, deploys new instantiations of VCEs and manages active instantiations of VCE deployments. Gateway 919 is the collection of computer software, hardware, and firmware that allows public cloud 904 to communicate through WAN 104.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 905 is similar to public cloud 904, except that the computing resources are only available for use by a single enterprise. While private cloud 905 is depicted as being in communication with WAN 104 in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 904 and private cloud 905 are both part of a larger hybrid cloud.

Block 901 further includes the software components discussed above in connection with FIGS. 2-8 to detect or predict system faults in a cooling system, such as cooling system 101. In one embodiment, such components may be implemented in hardware. The functions discussed above performed by such components are not generic computer functions. As a result, fault detection system 103 is a particular machine that is the result of implementing specific, non-generic computer functions.

In one embodiment, the functionality of such software components of fault detection system 103, including the functionality for detecting or predicting system faults, may be embodied in an application specific integrated circuit.

As stated above, a cooling system may implement two-phase cooling, which is generally used to remove and dissipate heat from high-power heat sources, such as electronics and lasers, or when the thermal energy needs to be transferred a significant distance between the heat source and the heat sink. In two-phase cooling systems, heat may be transferred by the evaporation and condensation of a portion or all of the working fluid. Typically, a liquid near saturation is pumped into the cold plate, where it starts to boil, cooling the electronics and storing the energy in the latent heat of the fluid. The two-phase (liquid and vapor) fluid then flows to the condenser, where the heat is removed, condensing the vapor, so that a single-phase (liquid) exits the condenser, and the cycle repeats. Heat transfer modes (manner of transferring heat) in such two-phase cooling systems include evaporation (type of vaporization that occurs on the surface of a liquid as it changes into the gas phase), pool boiling (boiling from a heated surface submerged in a large volume of stagnant liquid), flow boiling (occurs when a fluid circulates over a heated surface by external means such as a pump or due to the natural buoyancy effect), etc. Such two-phase heat transfer modes have much higher cooling capacities but are limited by a variety of system faults or instabilities, e.g., critical heat flux, flow maldistribution, flow reversal, etc. Critical heat flux describes the thermal limit of a phenomenon where a phase change occurs during heating, such as bubbles forming on a metal surface used to heat water, which suddenly decreases the efficiency of heat transfer, thus causing localized overheating of the heating surface. Flow maldistribution is the nonuniform distribution of the mass flow rate on one or more fluid sides, such as in a heat exchanger core. Flow reversal refers to the point at which the liquid begins to creep below the injection point. Such system faults or instabilities are often triggered suddenly during normal operation. If not identified and mitigated in time, such system faults or instabilities can lead to overheating issues and detrimental device failures. For example, when critical heat flux is triggered during pool boiling, the device temperatures can ramp up in the order of 150° C./min. Unfortunately, there is not currently a means for effectively detecting or predicting such system faults or instabilities in cooling systems.

Figure 10:
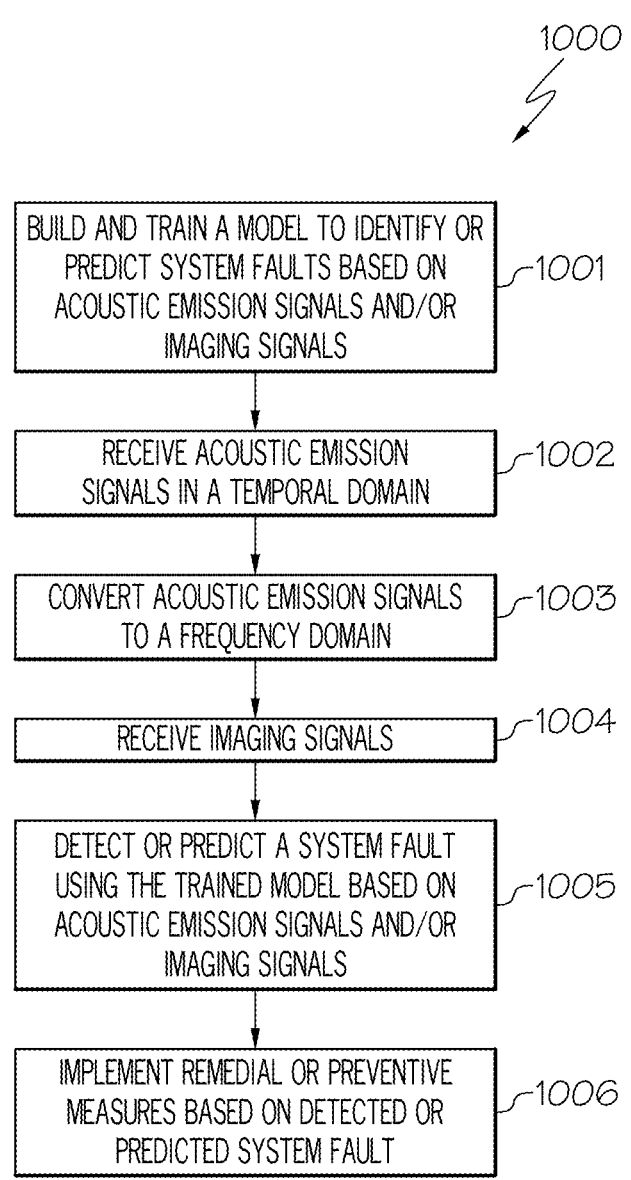
FIG. 10 is a flowchart of a method for detecting or predicting system faults in cooling systems in accordance with an embodiment of the present disclosure.
Figure 11:
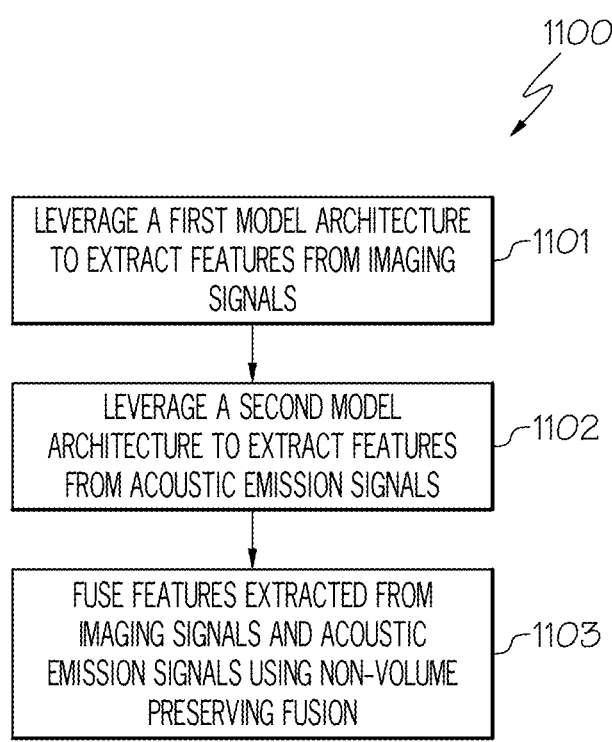
FIG. 11 is a flowchart of a method for fusing acoustic emission signals and imaging signals in the feature domain in accordance with an embodiment of the present disclosure.

The embodiments of the present disclosure provide a means for effectively detecting or predicting system faults (e.g., a boiling crisis, a critical heat flux, a flow maldistribution, a flow reversal) in cooling systems as discussed below in connection with FIGS. 10-11. FIG. 10 is a flowchart of a method for detecting or predicting system faults in cooling systems. FIG. 11 is a flowchart of a method for fusing acoustic emission signals and imaging signals in the feature domain.

As stated above, FIG. 10 is a flowchart of a method 1000 for detecting or predicting system faults in cooling systems in accordance with an embodiment of the present disclosure.

Referring to FIG. 10, in step 1001, machine learning engine 201 of fault detection system 103 builds and trains a model to detect or predict system faults in a cooling system, such as cooing system 101, based on acoustic emission signals and/or imaging signals.

As discussed above, in one embodiment, the model is trained to detect or predict system faults in cooling systems, such as cooling system 101, by utilizing features from historical information pertaining to the relationship of system faults (e.g., thermal failures) of cooling systems and acoustic emission signals (both in temporal domain and frequency domain) as well as the relationship of system faults (e.g., thermal faults) of cooling systems and imaging signals. Such relationships may be established via experimentation by an expert, such as shown in FIG. 3.

As shown in FIG. 3, when heat flux, q, exceeds a threshold of around 200 W/cm$^2$, a thermal failure 301 may be said to occur. In response to such a thermal failure 301, a heater may be turned off 302 thereby resulting in a safe operation 303 of the cooling system, such as cooling system 101.

As further shown in FIG. 3, heat flux, q, is calculated using temperatures (which may be obtained from temperature sensors placed at or near the cooling system, such as cooling system 101) using Fourier's law. As further shown in FIG. 3, acoustic emission signals obtained from the cooling system, such as cooling system 101, via hydrophones, such as hydrophones 106, may be represented in terms of sound (decibels) versus time (seconds). Furthermore, as shown in FIG. 3, acoustic emission signals obtained from the cooling system via acoustic emission sensors, such as acoustic emission sensors 105, may be represented in terms of energy (aJ) versus time (seconds). In one embodiment, such acoustic emission signals, such as those received from hydrophones (e.g., hydrophones 106), are in the temporal domain. Such signals in the temporal domain may be converted by converter engine 202 to the frequency domain (Hertz, Hz), such as in the form of a spectrogram, by performing the Fourier transformation on the acoustic emission signals from the temporal domain as discussed above. Such acoustic emission signals in the frequency domain may be represented in terms of frequency (Hz) and power (dB) versus time (minutes). In one embodiment, converter engine 202 utilizes various software tools for performing the Fourier transformation, including, but not limited to, Matlab®, FFTPACK, etc.

When system faults (e.g., thermal failures) of cooling system 101 are detected to occur, the particular features of the sound, acoustic emission (AE) energy and frequency of the acoustic emission signals may be identified as shown in FIG. 3 thereby providing a relationship between the acoustic emission signals and system faults.

Furthermore, in one embodiment, the acoustic signals from microphones, such as microphone 107, may also be utilized to determine the relationship between system faults and acoustic emission signals as shown in FIGS. 4A-4B.

As discussed above, in one embodiment, the background noise in the sounds captured by microphones, such as microphone 107, may be significant thereby making it difficult to determine the relationship between the acoustic emission signal outputted by the microphone, such as microphone 107, and the system fault of the cooling system (e.g., cooling system 101). As a result, a microphone, such as microphone 107, implements a filter to remove noise from sounds captured by microphone 107. For example, a high-pass or a low-pass filter may be utilized to remove noise from the microphone signals. For example, a high-pass filter (e.g., Butterworth high-pass filter) may pass microphone signals with a frequency higher than a certain cutoff frequency and attenuate microphone signals with frequencies lower than the cutoff frequency. A low-pass filter may pass microphone signals with a frequency lower than a selected cutoff frequency and attenuate microphone signals with frequencies higher than the cutoff frequency.

As shown in FIG. 4B, a thermal failure 401 corresponds to a spike in the acoustic emission signal provided by the microphone, such as microphone 107, which occurred at a time of around 100 seconds. As a result, features of the acoustic emission signal provided by the microphone may be learned when system faults of the cooling systems occur.

Furthermore, as discussed above, acoustic frequency analysis may be utilized for thermal failure detection. For example, the acoustic emission signals in the temporal domain are converted to the frequency domain. A relationship between the features of the acoustic emission signals in the frequency domain and system faults of cooling systems may be determined as shown in FIG. 5.

As shown in FIG. 5, a steady-state test was conducted for nucleate boiling (NB) and for critical heat flux (CHF). In one embodiment, the acoustic frequency is analyzed for both transient and steady-state boiling tests to identify the key acoustic features of safe operation (e.g., nucleate boiling) and thermal failure (e.g., critical heat flux).

Based on such information provided in the graph, a relationship between the acoustic emission signals in the frequency domain and system faults of cooling systems (e.g., cooling system 101) may be determined.

In a similar manner, a relationship between the features of imaging signals, such as boiling images (images in a boiling chamber), and system faults, such as a thermal failure resulting from heat flux exceeding a threshold limit (e.g., 200 W/cm$^2$), may be determined as shown in FIG. 6.

As shown in FIG. 6, a relationship between imaging images 601 and thermal failure 301 may be determined based on identifying the images 601 that transpired when a thermal failure 301 occurred, such as at a time that corresponds to 200 seconds. For example, image 602 represents a boiling image taken at a time corresponding to 200 seconds. Such an image may be associated with a system fault, such as thermal failure 301, which occurred at a time corresponding to 200 seconds.

In one embodiment, such information (acoustic emission signals from the temporal and frequency domains when system faults occur and imaging signals when system faults occur) discussed above may be utilized by machine learning engine 201 to train the model to detect or predict a system fault in cooling system 101.

In one embodiment, machine learning engine 201 uses a machine learning algorithm (e.g., supervised learning) to build the model to detect or predict a system fault in a cooling system, such as cooling system 101, using a sample data set containing historical information (acoustic emission signals from the temporal and frequency domains when system faults occur and imaging signals when system faults occur) pertaining to system faults in cooling systems.

Such a sample data set is referred to herein as the "training data," which is used by the machine learning algorithm to detect or predict a system fault in a cooling system. The algorithm iteratively makes predictions on the training data as to the detection or prediction of a system fault in a cooling system until the predictions achieve the desired accuracy as determined by an expert. Examples of such learning algorithms include nearest neighbor, Naïve Bayes, decision trees, linear regression, and neural networks.

After such a model is trained, it may be utilized to detect or predict a system fault in cooling system 101 using current acoustic emission signals and/or imaging signals obtained from acoustic emission sensors 105, hydrophones 106, microphones 107 and/or optical sensors 108 as discussed further below in connection with steps 1002-1004.

In one embodiment, machine learning engine 201 leverages a two model architecture to extract features from acoustic emission signals and imaging signals as discussed below in connection with FIG. 11.

FIG. 11 is a flowchart of a method 1100 for fusing acoustic emission signals and imaging signals in the feature domain in accordance with an embodiment of the present disclosure.

Referring to FIG. 11, in conjunction with FIGS. 1-10, in step 1101, machine learning engine 201 of fault detection system 103 leverages a first model architecture 701 (e.g., convolutional neural network) to extract features from imaging signals, such as boiling images 702, such as when system faults occur in cooling systems.

In step 1102, machine learning engine 201 of fault detection system 103 leverages a second model architecture 703 (e.g., recurrent neural network) to extract features from acoustic emission signals, such as sound pressure level data 704 (acoustic emission signals in the time domain) and spectrogram data 705 (acoustic emission signals in the frequency domain).

In step 1103, machine learning engine 201 of fault detection system 103 fuses the features extracted from the imaging signals and acoustic emission signals by concatenating the output layer of the first and second model architectures 701, 703, such as by using non-volume preserving-based fusion 706. Non-volume preserving-based fusion, as used herein, refers to features from the output layer of the first and second model architectures 701, 703 being efficiently fused via a non-linear process with multiple-level convolutional neural network-based fusion units.

In this manner, system faults may be detected or predicted in a more accurate and effective manner by using deep learning models based on multimodal signals (e.g., imaging signals and acoustic emission signals) as opposed to a single modality of signals, in which the features extracted from the multimodal signals may be fused together using non-volume preserving-based fusion to improve accuracy.

Returning to FIG. 10, in conjunction with FIGS. 1-9 and 11, in step 1002, fault detection system 103 receives acoustic emission signals from cooling system 101 in a temporal domain, such as in the form of sound pressure. In one embodiment, acoustic emission signals in the temporal domain are received from acoustic emission sensors 105, hydrophones 106 and/or microphones 107.

As discussed above, an acoustic emission sensor 105, as used herein, refers to a sensor that detects acoustic emission, such as the phenomenon of radiation of acoustic (elastic) waves in solids that occurs when a material undergoes irreversible changes in its internal structure. In one embodiment, such acoustic emission sensors 105 are in contact with cooling system 101. A hydrophone 106, as used herein, refers to a type of microphone designed to be used underwater (e.g., underwater in a boiling chamber of cooling system 101) for recording or listening to underwater sound.

A microphone 107, as used herein, refers to a transducer that converts sound into an electrical signal. In one embodiment, microphone 107 corresponds to a condenser microphone, which may be placed remotely to cooling system 101. In one embodiment, microphone 107 implements a filter to remove noise from sounds captured by microphone 107. For example, a high-pass or a low-pass filter may be utilized to remove noise from the captured sounds. For example, a high-pass filter (e.g., Butterworth high-pass filter) may pass microphone signals with a frequency higher than a certain cutoff frequency and attenuate microphone signals with frequencies lower than the cutoff frequency. A low-pass filter may pass microphone signals with a frequency lower than a selected cutoff frequency and attenuate microphone signals with frequencies higher than the cutoff frequency.

In step 1003, corrective engine 202 of fault detection system 103 converts the acoustic emission signals to a frequency domain.

As discussed above, in one embodiment, acoustic emission signals in the temporal domain are converted by converter engine 202 to the frequency domain (Hertz, Hz), such as in a spectrogram, by performing the Fourier transformation on the acoustic emission signals from the temporal domain. Such acoustic emission signals in the frequency domain may be represented in terms of frequency (Hz) and power (dB) versus time (minutes). In one embodiment, converter engine 202 utilizes various software tools for performing the Fourier transformation, including, but not limited to, Matlab®, FFTPACK, etc.

In step 1004, fault detection system 103 receives imaging signals from cooling system 101. In one embodiment, such imaging signals are obtained from optical sensors 108 (e.g., high-speed cameras).

As stated above, optical sensors 108 are utilized to obtain images of cooling system 101, such as the boiling chamber of cooling system 101. In one embodiment, such optical sensors 108 may correspond to a high-speed camera using differentially enhanced compressed ultrafast photography (Diff-CUP).

Upon obtaining such acoustic emission signals and imaging signals, in step 1005, fault detection system 103 utilizes the trained model to detect or predict a system fault in cooling system 101 based on the acoustic emission signals and/or imaging signals as discussed above.

In step 1006, corrective engine 203 of fault detection system 103 implements remedial or preventive measures based on the detected or predicted system fault.

As discussed above, corrective engine 203 utilizes a data structure (e.g., table) that includes a listing of remedial/preventive measures based on the detected/predicted system faults. In one embodiment, corrective engine 203 searches such a data structure for the system fault detected or predicted by the model, such as by using natural language processing. Upon identifying a matching system fault, the associated remedial or preventive measure may be obtained from the data structure and later implemented by corrective engine 203. For example, the detected system fault of a thermal failure (e.g., heat flux exceeding a threshold limit) may be associated with the remedial action of cooling device 102, such as turning off the heater. In another example, the predicted system fault of overheating or overcooling (e.g., heat flux approaching a threshold limit within a user-designated $W/cm^2$) may be associated with the preventive measure of preventing the overheating or overcooling, respectively, of device 102. In one embodiment, such a data structure is populated by an expert. In one embodiment, the data structure resides in the storage device (e.g., storage device 911, 915) of fault detection system 103.

In one embodiment, corrective engine 203 instructs elements (e.g., immersion heaters, cartridge heaters) of cooling system 101 to be turned off or to adjust the heat capacity (e.g., increase or decrease) produced by such heaters, such as shown in FIG. 8.

As discussed above, as shown in FIG. 8, chamber 801 includes a hydrophone 106 as well as an immersion heater 802 and a cartridge heater 803. An "immersion heater 802," as used herein, refers to an electric water heater that is found inside a hot water cylinder. A "cartridge heater 803," as used herein, refers to a tube-shaped, industrial Joule heating element.

In one embodiment, immersion heater 802, cartridge heater 803 are controlled via instructions from corrective engine 203, such as increasing or decreasing the heat capacity or being turned off.

As a result of the foregoing, embodiments of the present disclosure provide a means for effectively detecting or predicting system faults (e.g., a boiling crisis, a critical heat flux, a flow maldistribution, a flow reversal) in cooling systems in a non-intrusive manner. For example, system faults of a cooling system are detected or predicted based on obtaining acoustic emission signals and imaging signals from the cooling system. Such signals are obtained from the cooling system in a non-intrusive manner. For example, acoustic emission signals are obtained via acoustic emission sensors (contact type), hydrophones (microphone designed to be used underwater), and/or microphones (remote type). Imaging signals are obtained via optical sensors, such as high-speed cameras.

Furthermore, embodiments of the present disclosure provide a means for more accurately detecting or predicting system faults (e.g., a boiling crisis, a critical heat flux, a flow maldistribution, a flow reversal) in cooling systems by building and training a model to detect or predict system faults in a cooling system based on historical information pertaining to the relationship of system faults (e.g., thermal failures) of cooling systems and acoustic emission signals (both in temporal domain and frequency domain) as well as the relationship of system faults (e.g., thermal faults) of cooling systems and imaging signals. The accuracy of the model may be improved by leveraging a first model architecture (e.g., convolutional neural network) to extract features from imaging signals, such as boiling images, when system faults occur in cooling systems, as well as leveraging a second model architecture (e.g., recurrent neural network) to extract features from acoustic emission signals, such as sound pressure level data (acoustic emission signals in the time domain) and spectrogram data (acoustic emission signals in the frequency domain), when system faults occur in cooling systems. In one embodiment, the features extracted from the imaging signals and acoustic emission signals are fused by concatenating the output layer of the first and second model architectures, such as by using non-volume preserving-based fusion. In this manner, system faults may be detected or predicted in a more accurate and effective manner by using deep learning models based on multimodal signals (e.g., imaging signals and acoustic emission signals) as opposed to a single modality of signals, in which the features extracted from the multimodal signals may be fused together using non-volume preserving-based fusion to improve accuracy.

Furthermore, the principles of the present disclosure improve the technology or technical field involving detecting or predicting system faults in cooling systems. As discussed above, a cooling system may implement two-phase cooling, which is generally used to remove and dissipate heat from high-power heat sources, such as electronics and lasers, or when the thermal energy needs to be transferred a significant distance between the heat source and the heat sink. In two-phase cooling systems, heat may be transferred by the evaporation and condensation of a portion or all of the working fluid. Typically, a liquid near saturation is pumped into the cold plate, where it starts to boil, cooling the electronics and storing the energy in the latent heat of the fluid. The two-phase (liquid and vapor) fluid then flows to the condenser, where the heat is removed, condensing the vapor, so that a single-phase (liquid) exits the condenser, and the cycle repeats. Heat transfer modes (manner of transferring heat) in such two-phase cooling systems include evaporation (type of vaporization that occurs on the surface of a liquid as it changes into the gas phase), pool boiling (boiling from a heated surface submerged in a large volume of stagnant liquid), flow boiling (occurs when a fluid circulates over a heated surface by external means such as a pump or due to the natural buoyancy effect), etc. Such two-phase heat transfer modes have much higher cooling capacities but are limited by a variety of system faults or instabilities, e.g., critical heat flux, flow maldistribution, flow reversal, etc. Critical heat flux describes the thermal limit of a phenomenon where a phase change occurs during heating, such as bubbles forming on a metal surface used to heat water, which suddenly decreases the efficiency of heat transfer, thus causing localized overheating of the heating surface. Flow maldistribution is the nonuniform distribution of the mass flow rate on one or more fluid sides, such as in a heat exchanger core. Flow reversal refers to the point at which the liquid begins to creep below the injection point. Such system faults or instabilities are often triggered suddenly during normal operation. If not identified and mitigated in time, such system faults or instabilities can lead to overheating issues and detrimental device failures. For example, when critical heat flux is triggered during pool boiling, the device temperatures can ramp up in the order of 150° C./min. Unfortunately, there is not currently a means for effectively detecting or predicting such system faults or instabilities in cooling systems.

Embodiments of the present disclosure improve such technology by building and training a model (deep learning model) to detect or predict system faults in a cooling system based on acoustic emission signals (both in temporal and frequency domains) and/or imaging signals. Upon training the model to detect or predict system faults in a cooling system, acoustic emission signals may be obtained non-intrusively from the cooling system using acoustic emission sensors, hydrophones and/or microphones. In one embodiment, such obtained acoustic emission signals are in a temporal domain. In such an embodiment, the acoustic emission signals are converted from the temporal domain to the frequency domain, such as by performing a Fourier transformation. Additionally, upon training the model to detect or predict system faults in a cooling system, imaging signals (e.g., boiling images) may be obtained non-intrusively from the cooling system using optical sensors (e.g., high-speed cameras). The trained model may then detect or predict a system fault in the cooling system based on such information (acoustic emission signals, including in temporal and frequency domains, and/or the imaging signals). Furthermore, in one embodiment, system faults may be detected or predicted in a more accurate and effective manner by using deep learning models based on multimodal signals (e.g., imaging signals and acoustic emission signals)

as opposed to a single modality of signals, in which the features extracted from the multimodal signals are fused together using non-volume preserving-based fusion to improve accuracy. As a result, system faults in a cooling system are detected or predicted in a more accurate and effective manner. Furthermore, in this manner, there is an improvement in the technical field involving detecting or predicting system faults in cooling systems.

The technical solution provided by the present disclosure cannot be performed in the human mind or by a human using a pen and paper. That is, the technical solution provided by the present disclosure could not be accomplished in the human mind or by a human using a pen and paper in any reasonable amount of time and with any reasonable expectation of accuracy without the use of a computer.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer-implemented method for detecting or predicting system faults in cooling systems, the method comprising:

building and training a model to detect or predict a system fault in a cooling system based on acoustic emission signals in a temporal domain and a frequency domain;

receiving acoustic emission signals from said cooling system in a temporal domain;

converting said acoustic emission signals from said temporal domain to a frequency domain; and detecting or predicting a system fault in said cooling system using said trained model based on said acoustic emission signals received from said cooling system in said temporal and frequency domains; and implementing a remedial or a preventive measure based on said detected or predicted system fault, wherein said cooling system is utilized to remove and dissipate heat from a device, wherein said remedial measure comprises cooling said device, and wherein said preventive measure comprises preventing overheating or overcooling of said device.

2. The method as recited in claim 1 further comprising:

building and training said model to detect or predict said system fault in said cooling system based on said acoustic emission signals in said temporal domain and said frequency domain as well as based on imaging signals;

receiving imaging signals from said cooling system obtained from one or more optical sensors; and detecting or predicting said system fault in said cooling system using said trained model based on said acoustic emission signals received from said cooling system in said temporal and frequency domains and based on said imaging signals receiving from said cooling system.

3. The method as recited in claim 2, wherein said model leverages a first model architecture for extracting features from said imaging signals and a second model architecture for extracting features from said acoustic emission signals in said temporal and frequency domains.

4. The method as recited in claim 3, wherein said first model architecture comprises a convolutional neural network, wherein said second model architecture comprises a recurrent neural network.

5. The method as recited in claim 3 further comprising:

fusing said features extracted from said imaging signals and said acoustic emission signals in said temporal and frequency domains by concatenating an output layer of said first and second model architectures.

6. The method as recited in claim 5, wherein said fusion of said features extracted from said imaging signals and said acoustic emission signals in said temporal and frequency domains is performed using non-volume preserving-based fusion.

7. The method as recited in claim 1, wherein said acoustic emission signals in said temporal domain are in a form of sound pressure, wherein said acoustic emission signals in said temporal domain are received from one or more acoustic emission sensors, one or more hydrophones and/or one or more microphones.

8. The method as recited in claim 7, wherein said acoustic emission signals in said temporal domain are received from one or more microphones, and wherein said one or more microphones implement a filter to remove noise from captured sounds.

9. The method as recited in claim 1, wherein said acoustic emission signals in said frequency domain are in a form of a spectrogram.

10. The method as recited in claim 1, wherein said system fault comprises one or more of the following: a boiling crisis, a critical heat flux, a flow maldistribution, and a flow reversal.

11. A computer program product for detecting or predicting system faults in cooling systems, the computer program product comprising one or more non-transitory computer readable storage mediums having program code embodied therewith, the program code comprising programming instructions for:

building and training a model to detect or predict a system fault in a cooling system based on acoustic emission signals in a temporal domain and a frequency domain;

receiving acoustic emission signals from said cooling system in a temporal domain;

converting said acoustic emission signals from said temporal domain to a frequency domain; and detecting or predicting a system fault in said cooling system using said trained model based on said acoustic emission signals received from said cooling system in said temporal and frequency domains; and implementing a remedial or a preventive measure based on said detected or predicted system fault, wherein said cooling system is utilized to remove and dissipate heat from a device, wherein said remedial measure comprises cooling said device, and wherein said preventive measure comprises preventing overheating or overcooling of said device.

12. The computer program product as recited in claim 11, wherein the program code further comprises the programming instructions for:

building and training said model to detect or predict said system fault in said cooling system based on said acoustic emission signals in said temporal domain and said frequency domain as well as based on imaging signals;

receiving imaging signals from said cooling system obtained from one or more optical sensors; and detecting or predicting said system fault in said cooling system using said trained model based on said acoustic emission signals received from said cooling system in said temporal and frequency domains and based on said imaging signals receiving from said cooling system.

13. The computer program product as recited in claim 12, wherein said model leverages a first model architecture for extracting features from said imaging signals and a second model architecture for extracting features from said acoustic emission signals in said temporal and frequency domains.

14. A system, comprising:

a memory for storing a computer program for detecting or predicting system faults in cooling systems; and a processor connected to said memory, wherein said processor is configured to execute program instructions of the computer program comprising:

building and training a model to detect or predict a system fault in a cooling system based on acoustic emission signals in a temporal domain and a frequency domain;

receiving acoustic emission signals from said cooling system in a temporal domain;

converting said acoustic emission signals from said temporal domain to a frequency domain; and detecting or predicting a system fault in said cooling system using said trained model based on said acoustic emission signals received from said cooling system in said temporal and frequency domains; and implementing a remedial or a preventive measure based on said detected or predicted system fault, wherein said cooling system is utilized to remove and dissipate heat from a device, wherein said remedial measure comprises cooling said device, and wherein said preventive measure comprises preventing overheating or over-cooling of said device.

15. The system as recited in claim 14, wherein the program instructions of the computer program further comprise:

building and training said model to detect or predict said system fault in said cooling system based on said acoustic emission signals in said temporal domain and said frequency domain as well as based on imaging signals;

receiving imaging signals from said cooling system obtained from one or more optical sensors; and detecting or predicting said system fault in said cooling system using said trained model based on said acoustic emission signals received from said cooling system in said temporal and frequency domains and based on said imaging signals receiving from said cooling system.

16. The system as recited in claim 15, wherein said model leverages a first model architecture for extracting features from said imaging signals and a second model architecture for extracting features from said acoustic emission signals in said temporal and frequency domains.

* * * * *